United States Patent [19]

Balasubramanian et al.

[11] 4,140,921

[45] Feb. 20, 1979

[54] GENERALIZED PERFORMANCE POWER OPTIMIZED PLA CIRCUITS

[75] Inventors: Peruvemba S. Balasubramanian, Manassas; Stephen B. Greenspan, Reston; Krishnamurthi Venkataraman, Manassas, all of Va.

[73] Assignee: International Business Machines Corporation, Armonk, N.Y.

[21] Appl. No.: 829,417

[22] Filed: Aug. 31, 1977

[51] Int. Cl.$^2$ .................... H03K 17/28; H03K 19/08; H03K 19/20; G11C 17/04

[52] U.S. Cl. .................................. 307/208; 307/205; 307/207; 307/251; 307/304; 364/716; 365/104; 365/194

[58] Field of Search ............... 307/203, 205, 207, 208, 307/251, 270, DIG. 5, DIG. 1; 365/103, 104, 194, 198, 230, 231; 364/716

[56] References Cited

U.S. PATENT DOCUMENTS

| | | | |
|---|---|---|---|
| 3,974,366 | 8/1976 | Hebenstreit | 307/207 X |
| 3,993,919 | 11/1976 | Cox et al. | 307/207 X |
| 4,016,431 | 4/1977 | Henle et al. | 307/208 |

OTHER PUBLICATIONS

Delahanty et al., "PLA Driver with Integral Race Prevention," IBM Tech. Discl. Bull., vol. 19, No. 1, pp. 152–153, 6/1976.

Goertzel et al., "Automatic Power Minization and Delay Assignment for Semiconductor Circuits," IBM Tech. Discl. Bull., vol. 15, No. 6, pp. 2024–2025, 11/1975.

Leininger, "Designing Internal Delays in Large Scale Integrated Circuit Chips," IBM Tech. Discl. Bull., vol. 15, No. 2, pp. 421–422, 7/1972.

*Primary Examiner*—Larry N. Anagnos
*Attorney, Agent, or Firm*—John E. Hoel

[57] ABSTRACT

An array of parallel FET load circuits on an IC (integrated circuit) chip can have their respective signal delays equalized where their nodal capacitances are different or alternately can have their signal delays set for different durations to meet the needs of a subsequent circuit, by adjusting the current driving capacity of a driver driving each circuit to meet the desired delay requirements thereof.

6 Claims, 3 Drawing Figures

GENERALIZED PERFORMANCE POWER OPTIMIZED PLA CIRCUITS

FIELD OF THE INVENTION

The invention disclosed broadly relates to FET circuits and more particularly relates to such circuits used in programmed logic arrays.

BACKGROUND OF THE INVENTION

The design alternatives available to MOSFET LSI designers are PLA master slices and PLA macro which offer non-optimized designs (performance, power and density) for minimal physical design effort or custom LSI designs, offering an optimized approach at the expense of physical design effort. Computer assisted design systems which have addressed custom LSI design have offered power/performance optimization but require significant physical design effort. PLA computer assisted design systems eliminate the physical design effort but do not offer any performance or power optimization capability.

OBJECTS OF THE INVENTION

It is therefore an object of the invention to provide an array of parallel FET load circuits on an IC chip which have their respective signal delays equalized where their nodal capacitances are different.

It is another object of the invention to provide an array of parallel FET load circuits having signal delays of predetermined different durations.

SUMMARY OF THE INVENTION

These and other objects, features and advantages are provided by the power and performance optimized PLA circuit disclosed herein.

In an array of parallel FET load circuits on an IC chip, for which equal delays for different capacitive loads are desired, each circuit has an input node, characterized by a capacitance, and an output node; and each circuit input node is connected to an FET driver with a gate width/length ratio, for propagating a signal to the respective driver output node. A first driver has a first gate width/length ratio, and is connected to a first FET load having the largest capacitance and therefore a maximum initial path delay, for propagating the corresponding signal between the input and output nodes of the FET circuit at the maximum delay. A second driver has a second gate width/length ratio less than the first gate width/length ratio and is connected to a second FET load having a capacitance less than that of the first FET load, for propagating the corresponding signal between the input and output node at said maximum delay. A third driver has a third width/length ratio, connected to a third FET load having a capacitance less than the first FET load, for propagating the corresponding signal between the input and output node at said maximum delay. The resultant current capacity of the second and third drivers thus is optimized to minimize power dissipation on the IC chip.

Alternately, the circuit may be constructed to achieve programmed unequal delays. An input register is connected to a plurality of input data lines, for receiving asynchronous data input signals and outputting the data signals synchronously on output lines at a first time. A multiple path programmable delay stage has a plurality of inputs, each respectively connected to one of the output lines of the input register, and a plurality of output lines. A utilization circuit has a plurality of input lines each respectively connected to one of the output lines of the multiple path programmable delay stage, the utilization circuit requiring the receipt of certain ones of the data signals over certain ones of its input lines at different times subsequent to the first time. The multiple path programmable delay stage includes a plurality of parallel path circuits, each circuit having a driver with a programmable current driving capacity and a characteristic output node capacitance, each output driver node being connected to one of the output lines of the multiple path programmable delay stage and each current driver driving capacity being adjusted to delay the data signal propagated therethrough to conform with the required signal delay of the input line to which it is connected, of the utilization circuit.

DESCRIPTION OF THE FIGURES

These and other objects, features and advantages of the invention will be more fully understood with reference to the accompanying drawings.

DESCRIPTION OF THE PREFERRED EMBODIMENT

Figure 1:
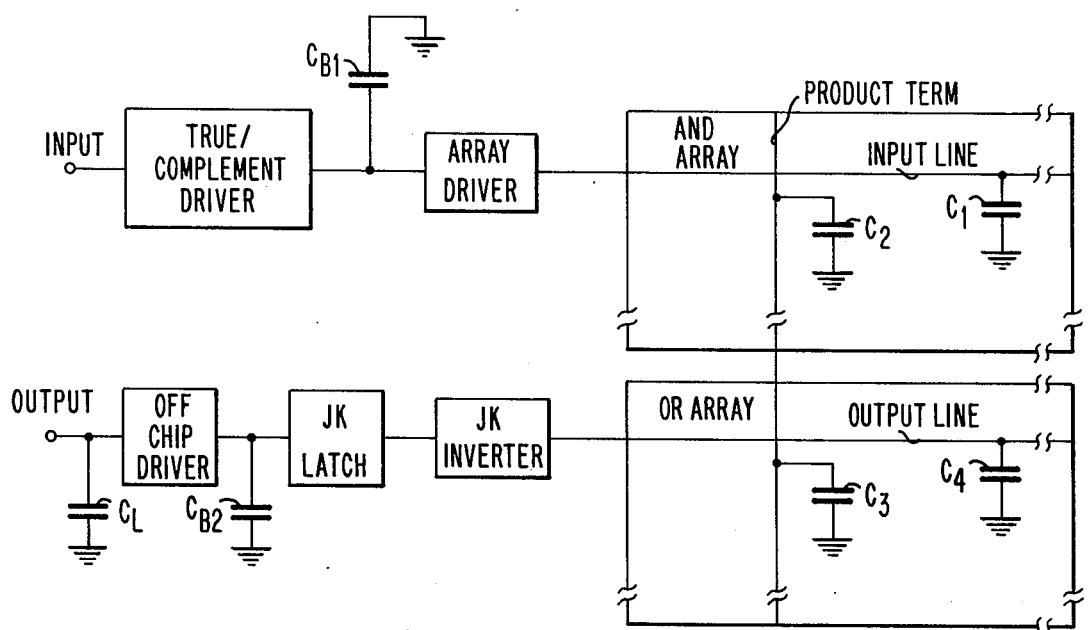
FIG. 1 shows a PLA chip data path with significant loads.

The PLA design can be broken into main functional blocks with the most significant capacitive load variables defined as $C_{B1}$, $C_{B2}$, the bus structure capacitance. $C_1$, $C_2$, $C_3$, $C_4$ represent the AND/OR array capacitive loading due to array device capacitance, and $C_L$ which represents the output capacitance of the PLA (see FIG. 1). It is proposed that the key performance determining devices be sized to meet performance objectives that a designer specifies.

Figure 2:
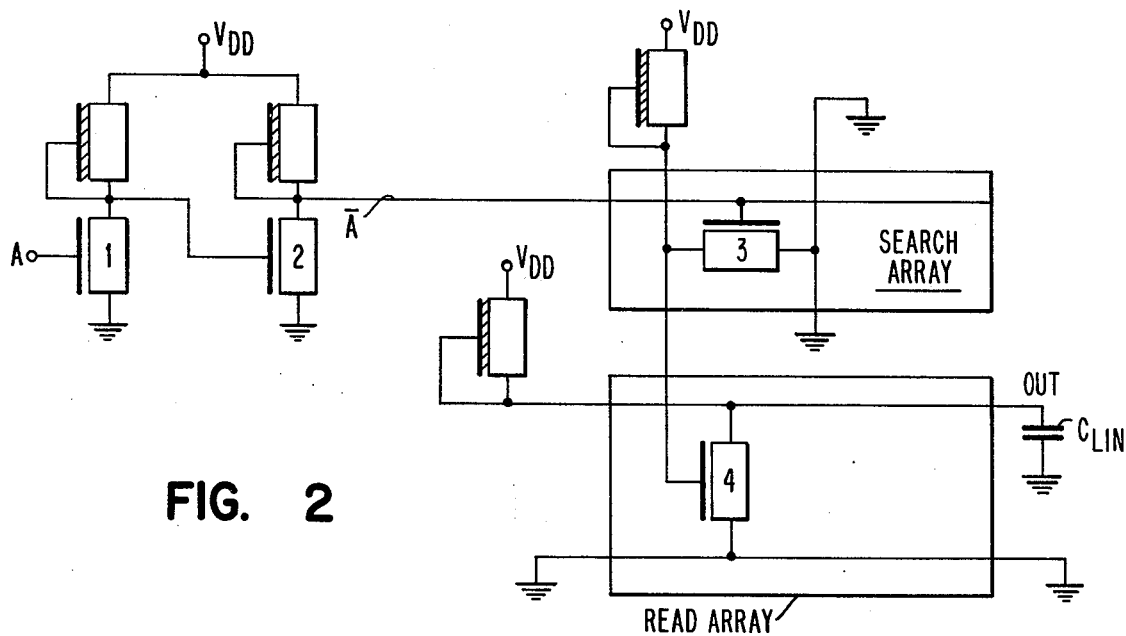
FIG. 2 shows some of the key devices which are optimized.
Figure 3:
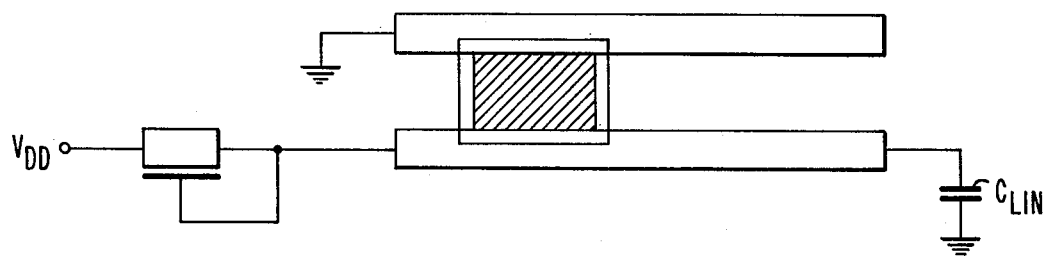
FIG. 3 shows an FET device in a PLA array.

Some of the key devices which are optimized are shown in FIG. 2 (devices 1 through 4). In addition to the true/complement driver devices 1 and 2, the AND and OR device sizes 3 and 4 would be changed to reduce the loading in the critical path. Once the critical path delay has been met, all other paths would have devices sized to meet the same performance. Since all other paths have less loading than the critical path, a significant power dissipation saving would result. Steps 1 – 7 of the optimization technique are shown below:

Step 1. User inputs the bit patterns to be personalized for the search and the read arrays.

Step 2. The device sizes are computed as follows:

$$T_d = Q/I_d = CV/I_d \qquad (1)$$

$$I_d = WLR\, \epsilon_0 \epsilon_{OX}/T_{OX}(V_G - V_T)^2 \mu_O \qquad (2)$$

$$T_d = CV/\{(WLR)\mu_O \epsilon_O (\epsilon_{OX}/T_{OX})(V_G - V_T)^2\}|WLR| \qquad (3)$$

$$T_d = C_{TOT} K_d/|WLR| \qquad (4)$$

where $$WLR = W/L$$

is the ratio of the value of the gate width to gate length ratio for the FET load device to the value of the gate width to gate length ratio for the FET active device 2, for example, in the FET inverter or driver circuit of FIG. 2 and $$K_d = V/\{(WLR) \mu_O \epsilon_O \epsilon_{OX}/T_{OX}(V_G - V_T)^2\} \quad (5)$$

$$\mu_O = \text{electronic mobility cm}^2/\text{Sec-V} \quad (6)$$

where $K_d = ns/pf$ normalized for WLR = 1.

If one can compute the total capacitance in each line, the device sizes could be computed using equation (7) to give equal delay.

$$C_{TOT} = C_L + (A + WLR)f_i \quad (7)$$

which includes overlap terms, etc., at used input.

Taking the OR array line as an example, $C_{TOT} = C_{LIN}$ + diffusion line capacitance + Miller capacitance due to the devices connected to the same line.

Step 3. Assume one of the device sizes = Max of (user inputted device size or the device size due to technology limitations).

Step 4. Set $T_d = C_{TOT} \cdot K_d/WLR$

Step 5. Then for all stages solve for WLR such that $T_d$ will be the same.

Step 6. Optimization—The device sizes are optimized as follows:

$$f = T_d + \lambda P \quad (8)$$

where
$T_d$ = delay time
P = power
$\lambda$ = the weight factor.

(A) compute f using the device sizes computed in Step 5.

(B) compute $WLR_{new}$ using Newton method as follows. Function f is a quadratic in WLR which can be written as follows:

$$f(WLR) = Q(WLR)^2 + d(WLR) + c \quad (9)$$

To find minimum, solve gradient $f(WLR) = 0$, $$\text{grad} f(WLR_{old}) = Q(WLR_{old}) + d, \quad (10)$$

$$\text{grad} f(WLR_{new}) = Q(WLR_{new}) + d, \quad (11)$$

grad at $f(WLR_{new}) = 0$ if the function is at a minimum point.

$$WLR_{new} = Q^{-1} \text{grad} f(WLR_{old}) + WLR_{old} \quad (12)$$

where
$Q^{-1} \text{grad} f(WLR_{old})$ is the Newton step $\Delta A$.

The vector $\Delta A$ is then used to calculate a new direction vector (normalized) with the following components:

$$\bar{z} = \frac{\Delta A_i}{\left[\sum_{j=1}^{n} \Delta A_j^2\right]^{\frac{1}{2}}} \quad i = 1, 2, ..., n \quad (13)$$

A one dimensional search is then conducted in the $\bar{z}$ direction using the relationship.

$$WLR_{new} = WLR_{old} + (\Delta WLR)\bar{z} \quad (14)$$

where
$\Delta WLR$ is the distance move in the $\bar{z}$ direction.

The one dimensional minimum of the function f is found using Fibonacci techniques. The procedure is an interval elimination search method. The location of points for function evaluation is based on the use of positive integers known as Fibonacci numbers.

When the one dimensional minimum has been found an overall convergence test is performed. If satisfied the procedure stops. If not the new direction vector is computed and the above procedure is repeated.

Step 7. The device sizes computed in Step 6 is passed on to a set of equations to build the PLA building block. Graphic language cards are outputted which can be used for artwork generation.

Note: The value of $\lambda$ is chosen depending on the power/performance requirement of the designer.

In summary, a design approach is proposed that would allow the user to have an optimum designed PLA which does not exist in the present PLA capability. The performance optimization would allow a designer to specify performance for a PLA and save significant amounts of power dissipation. The reduction in power dissipation would result in lower junction temperatures and improved component reliability. Card level thermal problems would also be alleviated.

The flexibility of specifying performance would eliminate many of the system design compromises which result from fixed performance components.

This approach is applicable for PLA master slice as well as PLA macros. The device sizes will be changed in a master slice approach. In a master slice approach, the device sizes are bounded by the maximum block size allowed in the initial design.

While the invention has been particularly shown and described with reference to the preferred embodiment thereof, it will be understood by those skilled in the art that the foregoing and other changes in form and details may be made therein without departing from the spirit and scope of the invention.

We claim:

1. An array of parallel FET load circuits on an integrated circuit chip, each circuit having an input node, characterized by a capacitance, and an output node, and each circuit connected to an FET driver having an FET load device connected to an FET active device with the node between the load device and the active device connected to said input node of said circuit, said driver characterized by a ratio of ratios which is the ratio of the value of the gate width to gate length ratio for the FET load device to the value of the gate width to gate length ratio for the FET active device, for propagating a signal from said input node to said output node of said circuit, comprising:

a first FET driver having a first ratio of ratios, connected to a first load circuit having the largest characteristic capacitance and therefore the maximum path delay, for propagating a signal from the input to the output node of the load circuit at said maximum delay;

a second driver having a second ratio of ratios less than said first ratio of ratios, connected to a second load circuit having a characteristic capacitance less than the characteristic capacitance of said first load circuit, for propagating a signal between the input node and the output node at said maximum delay;

whereby the current capacity of said second driver is reduced to minimize power dissipation on the integrated circuit chip.

2. The improvement of claim 1, which further comprises:

said first load circuit comprising a series connected sequence of drivers and capacitive loads which propagate the corresponding signal at a first predetermined delay corresponding to said characteristic capacitance of said first circuit;

said second load circuit comprising a series connected sequence of drivers and capacitive loads which propagates the corresponding signal at a second predetermined delay corresponding to said characteristic capacitance of said second circuit;

where the magnitude of the first predetermined delay is less than the magnitude of the second predetermined delay.

3. The improvement of claim 2, which further comprises:

said series connected sequence of capacitive loads in said first load having an aggregate capacitance greater than said series connected sequence of capacitance in second load;

said series connected sequence of drivers in said first load having a greater current carrying capacity than said aggregate circuit carrying capacity of said second series connected sequence for drivers in said second load.

4. The circuit of claim 1, wherein:

said first load circuit comprising series array of capacitive load elements in a PLA search array and capacitive load elements in a PLA read array and an output load capacitance.

5. The circuit of claim 4, wherein:

said capacitive load elements in said PLA search array comprising distributed input line capacitance and FET insulated gate capacitance of the search array bits on said input line;

said capacitive load elements in said PLA read array comprising distributed search array output line capacitance and FET insulated gate capacitance of the read array bits on said output line within said read array;

said output load capacitance comprising distributed line capacitance for the output line of said read array and the input load capacitance of a circuit driver by the read array.

6. A circuit for achieving programmed unequal delays, comprising:

an input register connected to a plurality of input data lines, for receiving asynchronous data input signals and outputting said data signals synchronously on output lines at a first time;

a multiple path programmable delay stage having a plurality of inputs, each respectively connected to one of said output lines of said input register, and a plurality of output lines;

a utilization circuit having a plurality of input lines each respectively connected to one of said output lines of said multiple path programmable delay stage, the utilization circuit requiring the receipt of certain ones of said data signals over certain ones of its input lines at different times subsequent to said first time;

said multiple path programmable delay stage including a plurality of parallel path circuits, each circuit having a driver with a programmable current driving capacity and a characteristic output node capacitance, each said driver output nodes being connected to one of said output lines of said multiple path programmable delay stage, each said driver current driving capacity being adjusted to delay the data signal propagated therethrough to conform with said required signal delay of the input line to which it is connected of said utilization circuit.

* * * * *